(12) United States Patent
Hu et al.

(10) Patent No.: US 11,226,645 B2
(45) Date of Patent: Jan. 18, 2022

(54) REFERENCE VOLTAGE GENERATING CIRCUIT

(71) Applicant: Sitronix Technology Corp., Hsinchu County (TW)

(72) Inventors: Yao-Sheng Hu, Hsinchu County (TW); Li-Yu Huang, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 0 days.

(21) Appl. No.: 16/876,137

(22) Filed: May 18, 2020

(65) Prior Publication Data

US 2021/0034083 A1 Feb. 4, 2021

Related U.S. Application Data

(60) Provisional application No. 62/848,595, filed on May 16, 2019.

(51) Int. Cl.
*G05F 1/59* (2006.01)

(52) U.S. Cl.
CPC ..................... *G05F 1/59* (2013.01)

(58) Field of Classification Search
CPC ...... G05F 1/46–585; G05F 1/59; G05F 1/595; H02M 1/0045; H02M 3/07–078; H03M 1/0845; H03M 1/0863; H03M 1/12
See application file for complete search history.

(56) References Cited

U.S. PATENT DOCUMENTS

| | | | |
|---|---|---|---|
| 5,146,395 A * | 9/1992 | McKie | H02M 3/07 363/13 |
| 6,720,896 B2 | 4/2004 | Semmler | |
| 7,746,302 B2 * | 6/2010 | Lee | G09G 3/3655 345/87 |
| 8,649,201 B2 | 2/2014 | Kato | |
| 9,223,332 B1 * | 12/2015 | Himmelbauer | G11C 5/147 |
| 10,038,454 B2 | 7/2018 | de Figueiredo | |
| 10,236,903 B2 | 3/2019 | Lin | |
| 10,763,881 B1 * | 9/2020 | Nittala | H03M 1/365 |
| 2002/0099988 A1 | 7/2002 | Osama | |
| 2003/0058032 A1 * | 3/2003 | Takagiwa | G11C 5/147 327/540 |
| 2014/0197807 A1 * | 7/2014 | Tercariol | H02M 1/14 323/234 |

(Continued)

FOREIGN PATENT DOCUMENTS

| | | |
|---|---|---|
| TW | 490845 | 6/2002 |
| TW | I387359 B1 | 2/2013 |
| TW | 201349859 A | 12/2013 |

OTHER PUBLICATIONS

Yao-Sheng Hu, "A 0.6V 1.63fJ/c.-s. Detective Open-Loop Dynamic System Buffer for SAR ADC in Zero-Capacitor TDDI System", IEEE Asian Solid-State Circuits Conference, Nov. 5-7, 2018, pp. 103-106, IEEE, Tainan, Taiwan.

*Primary Examiner* — Fred E Finch, III
(74) *Attorney, Agent, or Firm* — Winston Hsu

(57) ABSTRACT

The present invention provides a reference voltage generating circuit. The reference voltage generating circuit includes a charge supply circuit providing a first reference voltage during a first period; and a voltage supply circuit providing a second reference voltage during a second period. The voltage supply circuit does not provide the second reference voltage during the first period.

14 Claims, 5 Drawing Sheets

(56) References Cited

U.S. PATENT DOCUMENTS

| | | | |
|---|---|---|---|
| 2017/0063231 A1* | 3/2017 | Wang | G05F 1/56 |
| 2019/0107857 A1* | 4/2019 | Ivanov | H02M 3/07 |
| 2019/0235546 A1* | 8/2019 | Tang | H02M 3/07 |
| 2019/0302817 A1* | 10/2019 | Rosolowski | G05F 1/575 |
| 2020/0145017 A1* | 5/2020 | Pardoen | H03F 1/0211 |
| 2020/0333814 A1* | 10/2020 | Nandi | H03M 1/0845 |
| 2020/0381994 A1* | 12/2020 | Choi | H02M 3/06 |
| 2021/0181775 A1* | 6/2021 | Markulic | H03M 1/466 |

* cited by examiner

REFERENCE VOLTAGE GENERATING CIRCUIT

CROSS REFERENCE TO RELATED APPLICATION

This application claims the benefit of U.S. Provisional Application No. 62/848,595, filed on May 16, 2019 and entitled "Voltage Driving Circuit", the contents of which are incorporated herein by reference.

BACKGROUND OF THE INVENTION

1. Field of the Invention

The present invention relates to a reference voltage generating circuit, and more particularly, to a reference voltage generating circuit capable of providing a stable reference voltage and reducing power consumption.

2. Description of the Prior Art

In the field of electronic technology, a reference voltage generating circuit is of certain importance. The reference voltage generating circuit is utilized for generating and providing a stable reference voltage to a circuit of need, such as an analog to digital converter. However, during operation of the circuit receiving the reference voltage, the circuit draws electrical energy, such as current, which will affect a voltage level of the reference voltage and affect accuracy of operation of the circuit.

In this case, many reference voltage generating circuits have been developed to provide a stable reference voltage, such as U.S. Pat. No. 10,236,903. However, this conventional structure consumes more power and cannot dynamically maintain the voltage level of the reference voltage in real time. As shown in FIG. 5 of U.S. Pat. No. 10,236,903, the power supply circuit, including the supply voltage VDD, the current source 560, and the resistor R1, is continuously coupled to the analog to digital converter and the charge compensation circuit 510 to supply power to maintain the voltage level of the reference voltage, thereby consuming quite much power. Furthermore, this conventional structure performs charge compensation according to output bits converted from an analog input signal by the analog to digital converter to maintain the voltage level of the reference voltage. That is, this conventional structure performs charge compensation after the analog to digital converter operates and draws current, causing fluctuation of the voltage level of the reference voltage level. Therefore, the fluctuation of the voltage level of the reference voltage cannot be reduced in real time, which affects the stability of the reference voltage and the conversion accuracy of the analog to digital converter.

In view of this, it is necessary to improve the conventional technology.

SUMMARY OF THE INVENTION

It is therefore an objective of the present invention to provide a reference voltage generating circuit capable of provide a reference voltage by utilizing circuits with different electrical energy supply characteristics according to the degree of influence on the reference voltage due to the electrical energy consumption of the function circuit operation, to provide the stable reference voltage, and also capable of reducing power consumption of the reference voltage generating circuit to save power and stabilize the voltage level of the reference voltage in real time.

The present invention discloses a reference voltage generating circuit. The reference voltage generating circuit includes a charge supply circuit providing a first reference voltage during a first period; and a voltage supply circuit providing a second reference voltage during a second period. The voltage supply circuit does not provide the second reference voltage during the first period.

These and other objectives of the present invention will no doubt become obvious to those of ordinary skill in the art after reading the following detailed description of the embodiment that is illustrated in the various figures and drawings.

DETAILED DESCRIPTION

Certain words are used in the specification and claims to refer to specific components. However, those skilled in the art of the technical field of the present invention should understand that the manufacturer may refer to the same component in different terms. Moreover, this specification and claims do not use the difference in the name as away to distinguish the components, but the difference in the overall technology of the components as the criterion for distinguishing. The "comprise" mentioned in the entire specification and claims is an open-ended term, so it should be interpreted as "include but not limited to". Furthermore, the term "coupling" here includes any direct and indirect means of connection. Therefore, if a first device is coupled to a second device, it means that the first device may be directly connected to the second device, or may be indirectly connected to the second device through other devices or other connection means.

Figure 1:
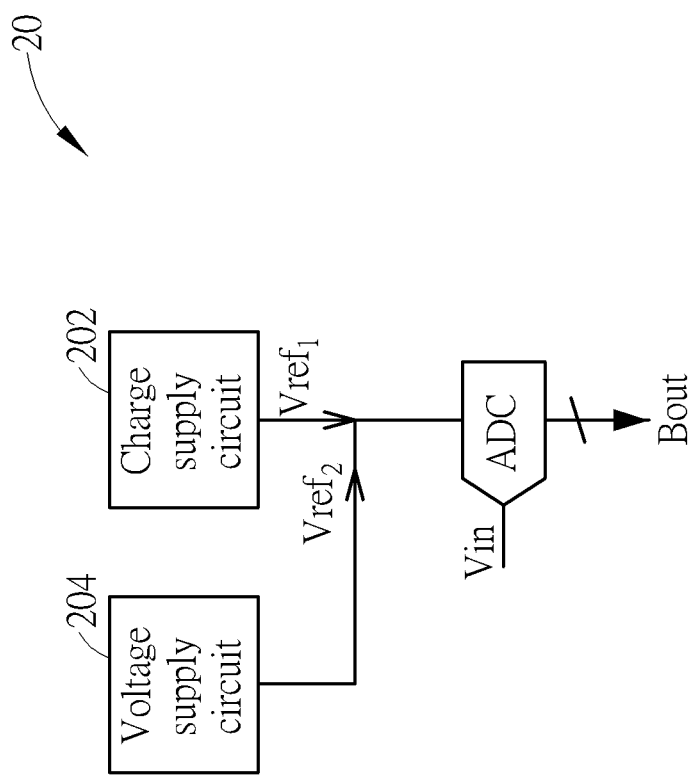
FIG. 1 is a schematic diagram of a reference voltage generating circuit according to an embodiment of the present invention.

Please refer to FIG. 1, which is a schematic diagram of a reference voltage generating circuit 20 according to an embodiment of the present invention. As shown in FIG. 1, the reference voltage generating circuit 20 includes a charge supply circuit 202 and a voltage supply circuit 204. The charge supply circuit 202 and the voltage supply circuit 204 are coupled to a functional circuit, and the functional circuitry may be an analog to digital converter ADC in this embodiment. The analog to digital converter ADC may be a successive approximation register formula (Successive Approximation Register, SAR) analog to digital converter. This embodiment takes the reference voltage generating circuit 20 utilized for an analog to digital converter as an example for illustration, but the present invention does not limit that the reference voltage generating circuit 20 is only utilized for the analog to digital converter. The reference voltage generating circuit 20 of the present invention is utilized for generating a stable reference voltage, and may be applied to any functional circuit that requires a reference voltage.

Please continue to refer to FIG. 1, the charge supply circuit 202 generates a first reference voltage $Vref_1$, and the voltage supply circuit 204 generates a second reference voltage $Vref_2$. The charge supply circuit 202 provides the first reference voltage $Vref_1$ to the analog to digital converter ADC during a first period, and the voltage supply circuit 204 provides the second reference voltage $Vref_2$ to the analog to digital converter ADC during a second period. In addition, the voltage supply circuit 204 does not provide the second reference voltage $Vref_2$ to the analog to digital converter ADC during the first period. In other words, when the charge supply circuit 202 provides the first reference voltage $Vref_1$ to the analog to digital converter ADC, the voltage supply circuit 204 does not provide the second reference voltage $Vref_2$ to the analog to digital converter ADC, so as to reduce power consumption of the reference voltage generating circuit 20 and save power. In another embodiment of the present invention, the charge supply circuit 202 may not provide the first reference voltage $Vref_1$ to the analog to digital converter ADC during the second period. The analog to digital converter ADC receives an analog input signal Vin and operates according to the first reference voltage $Vref_1$ and the second reference voltage $Vref_2$, to convert the input signal Vin to generate a digital output signal Bout.

According to the above description, the charge supply circuit 202 and the voltage supply circuit 204 respectively provide the first reference voltage $Vref_1$ and the second reference voltage $Vref_2$ to the analog to digital converter ADC during different periods. The first period and the second period are operation periods of the functional circuit. In this embodiment, the first period and the second period are the operation periods of the analog to digital converter ADC. The first period and the second period are not limited to the first period before the second period, and the first period may be earlier than the second period, or the second period is earlier than the first period.

In addition, a charge supply amount per unit time of the charge supply circuit 202 is different from a charge supply amount per unit time of the voltage supply circuit 204. In an embodiment of the present invention, the charge supply amount per unit time of the charge supply circuit 202 is greater than the charge supply amount per unit time of the voltage supply circuit 204, which means an ability of providing charges in a short time of the charge supply circuit 202 is better than an ability of providing charges in the short time of the voltage supply circuit 204. When the analog to digital converter ADC operates and draws a large current, that is, during the period when the analog to digital converter ADC consumes more charges/power, the charge supply circuit 202 may be utilized for providing the first reference voltage $Vref_1$ to the analog to digital converter ADC. Thus, the present invention avoids great fluctuations of the reference voltage received by the analog to digital converter ADC caused by the operation of the analog to digital converter ADC. That is, the charge supply circuit 202 may provide the stable reference voltage $Vref_1$ with small fluctuation, thereby maintaining conversion accuracy of the analog to digital converter ADC. In addition, when the analog to digital converter ADC operates and draws a small current, that is, during a period when the analog to digital converter ADC consumes less charges/power, the voltage supply circuit 204 may be utilized for providing the second reference voltage $Vref_2$ to the analog to digital converter ADC. In the embodiment of the present invention, a voltage level of the second reference voltage $Vref_2$ may be identical to or different from a voltage level of the first reference voltage $Vref_1$, which is determined by practical needs of functional circuit.

Figure 2A:
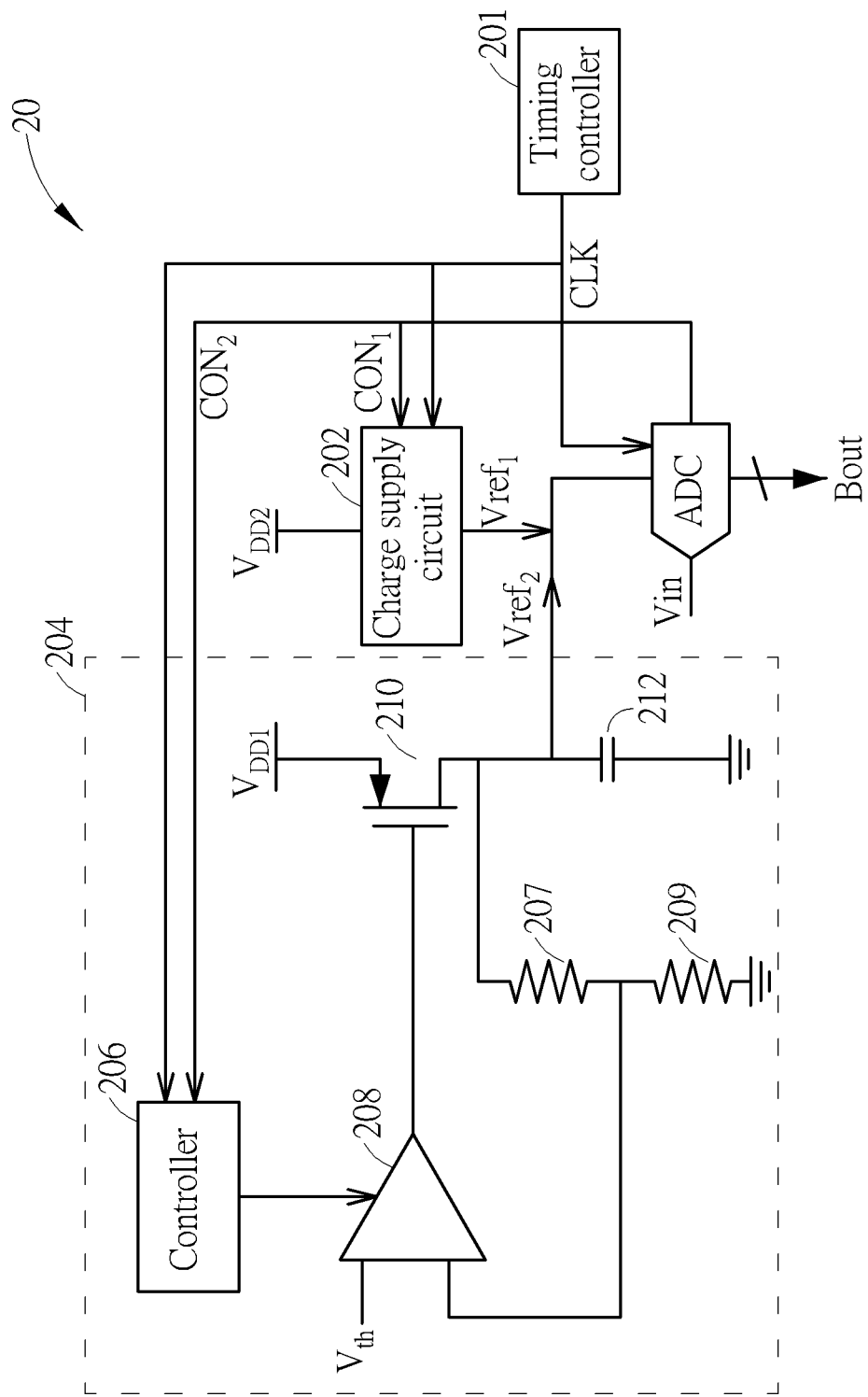
FIG. 2A is a schematic diagram of the reference voltage generating circuit according to another embodiment of the present invention.
Figure 2B:
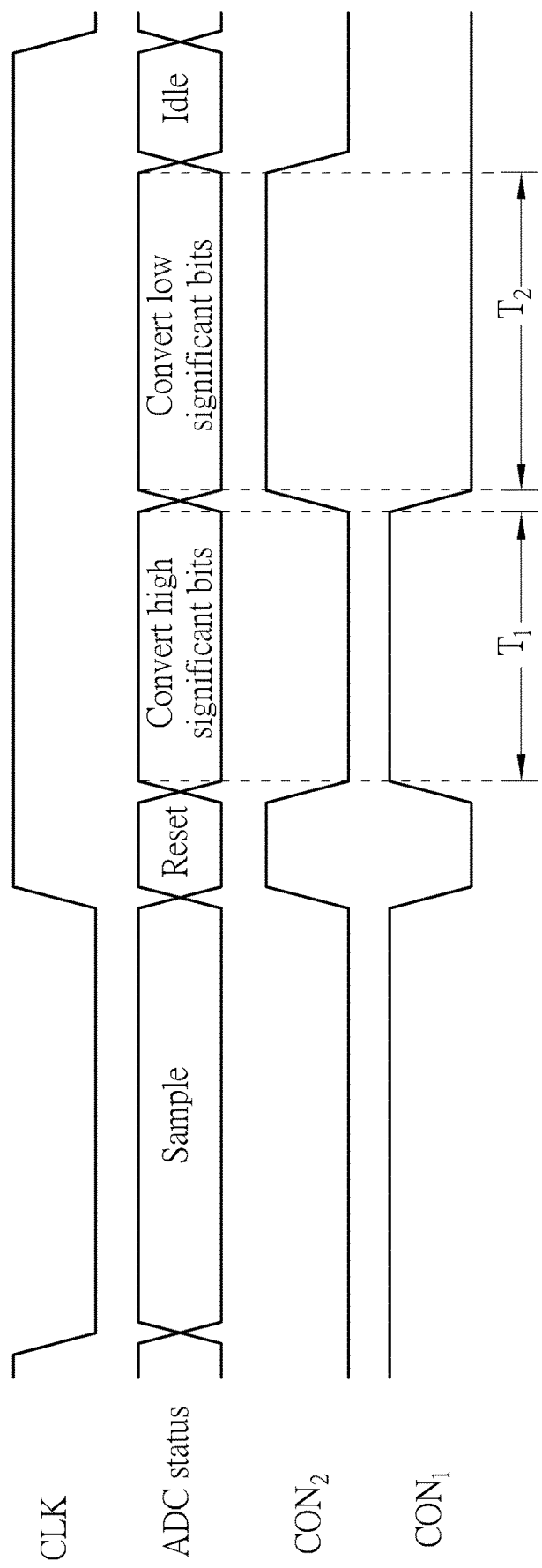
FIG. 2B is a timing chart of operations of the reference voltage generating circuit shown in FIG. 2A according to an embodiment of the present invention.

Please refer to FIG. 2A and FIG. 2B. FIG. 2A is a schematic diagram of the reference voltage generating circuit 20 according to another embodiment of the present invention. FIG. 2B is a timing chart of operations of the reference voltage generating circuit 20 shown in FIG. 2A according to an embodiment of the present invention. As shown in FIG. 2A and FIG. 2B, the reference voltage generating circuit 20 includes the charge supply circuit 202 and the voltage supply circuit 204. The charge supply circuit 202 is coupled to a supply voltage $V_{DD}$ to generate the first reference voltage $Vref_1$. The charge supply circuit 202 provides the first reference voltage $Vref_1$ to the analog to digital converter ADC during a period $T_1$ (the first period). The voltage supply circuit 204 generates the second reference voltage $Vref_2$ during a period $T_2$ (the second period), and provides the second reference voltage $Vref_2$ to the analog to digital converter ADC. The voltage supply circuit 204 does not provide the second reference voltage $Vref_2$ during the period $T_1$, thereby reducing power consumption of the reference voltage generating circuit 20 to save power.

Please continue to refer to FIG. 2A, a timing controller 201 is coupled to the charge supply circuit 202, the voltage supply circuit 204, and the analog to digital converter ADC, and generates a clock signal CLK. The charge supply circuit 202, the voltage supply circuit 204, and the analog to digital converter ADC operate according to the clock signal CLK. In this structure, when a level of the clock signal CLK is a low level, the analog to digital converter ADC samples the input signal Vin for subsequent analog to digital conversion. When the level of the clock signal CLK becomes a high level, the analog to digital converter ADC performs the analog to digital conversion, and the reference voltage generating circuit 20 may provide the first reference voltage $Vref_1$ and the second reference voltage $Vref_2$ to the analog to digital converter ADC as the reference voltage for the analog to digital converter ADC to perform the analog to digital conversion. The period $T_1$ is a period during which the analog to digital converter ADC converts at least one high significant bit (e.g. first 5 bits) of the input signal Vin. The period $T_2$ is a period during which the analog to digital converter ADC converts at least one low significant bit (e.g. the 6th bit and following bits) of the input signal Vin.

In this case, the analog to digital converter ADC may generate the control signals $CON_1$, $CON_2$ according to whether the significant bit currently converted from the input signal Vin is the high significant bit or the low significant bit. During the period $T_1$ that the analog to digital converter ADC converts the high significant bits, a level of the control signal $CON_1$ may become a high level to enable the charge supply circuit 202 to provide the first reference voltage $Vref_1$. When the analog to digital converter ADC converts the high significant bits, the analog to digital converter ADC draws a large current, that is, a large amount of charges, which may cause large fluctuations in the reference voltage provided to the analog to digital converter ADC. Since the charge supply circuit 202 may compensate charge/power consumption of the analog to digital converter ADC in a short time, by utilizing the charge supply circuit 202 to provide the first reference voltage $Vref_1$ to the analog to digital converter ADC, the present invention prevents operation of the analog to digital converter ADC from greatly affecting the voltage level of the first reference voltage $Vref_1$, that is, maintaining the voltage level of the first reference voltage $Vref_1$ to provide the stable first reference voltage $Vref_1$. In addition, during the period $T_1$, the level of the control signal $CON_2$ may become a low level to disable the voltage supply circuit 204 and thus the voltage supply circuit 204 does not provide the second reference voltage $Vref_2$ to the analog to digital converter ADC for power saving. During the period $T_2$ that the analog to digital converter ADC converts the low significant bits, since the analog to digital converter ADC draws less current, that is, less charge, when the analog to digital converter ADC converts the low significant bits, fluctuation of the reference voltage provided to the analog to digital converter ADC may be less. Thus, the level of the control signal $CON_2$ may become a high level to enable the voltage supply circuit 204 to provide the second reference voltage $Vref_2$ to the analog to digital converter ADC. The voltage supply circuit 204 may accurately maintain the voltage level of the second reference voltage $Vref_2$, so that the conversion accuracy is ensured when the analog to digital converter ADC converts the low significant bits of the input signal Vin. Since the conversion accuracy of the low significant bits determines overall conversion accuracy of the analog to digital converter ADC, accurately maintaining the voltage level of the second reference voltage $Vref_2$ may ensure detail (resolution) of the analog to digital conversion of the analog to digital converter ADC. In this way, the reference voltage generating circuit 20 may compensate the charge loss of the analog to digital converter ADC and may provide a stable reference voltage.

Figure 3:
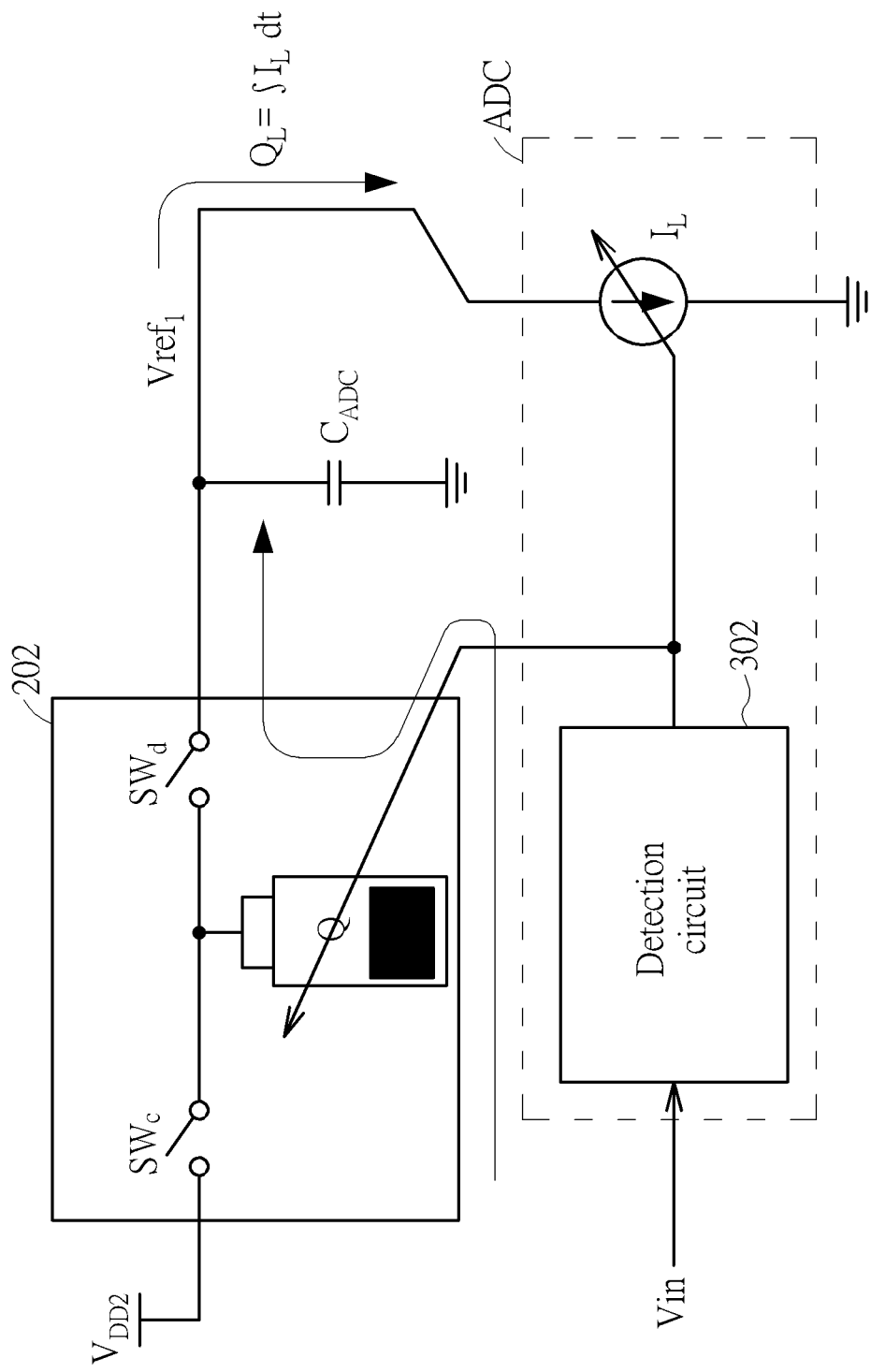
FIG. 3 is a schematic diagram of a charge supply circuit and an analog to digital converter according to an embodiment of the present invention.

In detail, please refer to FIG. 3, which is a schematic diagram of the charge supply circuit 202 and the analog to digital converter ADC according to an embodiment of the present invention. A power supply circuit (not shown) or the voltage supply circuit 204 may be coupled to the charge supply circuit 202, and provides a supply voltage $V_{DD2}$ to charge the charge supply circuit 202 for generating the first reference voltage $Vref_1$. In an embodiment of the present invention, the power supply circuit may be a system power supply. In one embodiment of the present invention, the charge supply circuit 202 may be a charge storage circuit, and comprise a plurality of energy storage elements Q, for example, comprise a plurality of capacitor constituting a capacitor bank, but the charge supply circuit 202 is not limited to only being the charge storage circuit. In addition, the charge supply circuit 202 includes a plurality of switches $SW_c$, $SW_d$. The switch $SW_c$ is coupled between the supply voltage $V_{DD2}$ and the energy storage elements Q, and the switch $SW_d$ is coupled between the energy storage elements Q and the analog to digital converter ADC. Specifically, the power supply circuit or the voltage supply circuit 204 provides the supply voltage $V_{DD2}$ to charge the charge supply circuit 202 (the switch $SW_c$ is conducted) before the period $T_1$, and the power supply circuit or the voltage supply circuit 204 is not coupled to (does not charge) the charge supply circuit 202 (the switch $SW_c$ is cut off) during the period $T_1$ to save power. At this time, the charge supply circuit 202 may generate the first reference voltage $Vref_1$ (the switch $SW_d$ is conducted) to provide the first reference voltage $Vref_1$ to the analog to digital converter ADC. Furthermore, the charge supply circuit 202 may provide a corresponding amount of charge according to the electrical energy consumption, such as power consumption or charge consumption, of the analog to digital converter ADC performing the analog to digital conversion during the period $T_1$. That is, the charge supply circuit 202 provides the first reference voltage $Vref_1$ according to the electrical energy consumption of the analog to digital converter ADC during the period $T_1$ to compensate the electrical energy consumption of the analog to digital converter ADC during the period $T_1$. Thus, the present invention prevents operation of the analog to digital converter ADC from greatly affecting the voltage level of the first reference voltage $Vref_1$, and maintains the voltage level of the first reference voltage $Vref_1$ to provide the stable first reference voltage $Vref_1$.

In addition, the reference voltage generating circuit 20 may further include a detection circuit 302, and the detection circuit 302 is coupled to the analog to digital converter ADC and the charge supply circuit 202. The detection circuit 302 detects the electrical energy consumption of the analog to digital converter ADC performing the analog to digital conversion during the period $T_1$ to control the charge supply circuit 202 to provide the corresponding amount of charge, so as to provide the stable first reference voltage $Vref_1$. Specifically, the detection circuit 302 may predict the electrical energy consumption affecting the first reference voltage $Vref_1$ during the period $T_1$ before the analog to digital converter ADC performs the analog to digital conversion on the high significant bits, to dynamically control the charge supply circuit 202 to provide the corresponding amount of charge in real time. The analog to digital converter ADC of the embodiment of FIG. 3 includes a variable current source $I_L$, which represents that the analog to digital converter ADC performs the analog to digital conversion during the period $T_1$ to draw currents of different magnitudes, and the charge supply circuit 202 provides the charge $Q_L$ corresponding to an integral of the currents drawn by the analog to digital converter ADC performing the analog to digital conversion during the period $T_1$. Since the analog to digital converter ADC is not a technical feature of the present invention, and different analog to digital converters have different circuit structures, detailed circuits are not shown in FIG. 3.

The embodiment of FIG. 3 illustrates that the detection circuit 302 is configured within the analog to digital converter ADC, and the detection circuit 302 may also be independent of the analog to digital converter ADC in other embodiments, and is not limited to this. In an embodiment of the present invention, the detection circuit 302 may detect the input signal Vin to predict the electrical energy consumption of the analog to digital converter ADC affecting the first reference voltage $Vref_1$ during the period $T_1$. In one embodiment of the present invention, the detection circuit 302 may utilize regression approximation or other methods for prediction. Thus, the reference voltage generating circuit 20 predicts the electrical energy consumption before the analog to digital converter ADC performs the analog to digital conversion on the input signal Vin, and may dynamically perform consumption in real time when the electrical energy consumption of operation of the analog to digital converter ADC causes the fluctuations of the first reference voltage $Vref_1$, to reduce the fluctuations of the first reference voltage $Vref_1$. The reference voltage generating circuit 20 almost simultaneously performs compensation in the moment that the first reference voltage $Vref_1$ encounters fluctuations. The detection circuit 302 together with the charge supply circuit 202 is configured in an open loop for compensation, thereby having fast reaction speed and saving power.

Please continue to refer to FIG. 3, the reference voltage generating circuit 20 may further include a capacitor $C_{ADC}$. The capacitor $C_{ADC}$ is coupled to the analog to digital converter ADC and the charge supply circuit 202. The charge supply circuit 202 provides the first reference voltage $Vref_1$ to the capacitor $C_{ADC}$ during the period $T_1$ to provide the first reference voltage $Vref_1$ to the analog to digital converter ADC. The capacitor $C_{ADC}$ may also be coupled to the voltage supply circuit 204, and the voltage supply circuit 204 provides the second reference voltage $Vref_2$ to the capacitor $C_{ADC}$ during the period $T_2$ to provide the second reference voltage $Vref_2$ to the analog to digital converter ADC. The capacitor $C_{ADC}$ may stabilize the first reference voltage $Vref_1$ and the second reference voltage $Vref_2$. The power supply circuit or the voltage supply circuit 204 charges the charge supply circuit 202 and also charges the capacitor $C_{ADC}$ before the period $T_1$. The power supply circuit or the voltage supply circuit 204 is not coupled to the capacitor $C_{ADC}$ and the charge supply circuit 202 during the period $T_1$.

In other words, by controlling operations of the switches $SW_c$, $SW_d$, the power supply circuit or the voltage supply circuit 204 provides the supply voltage $V_{DD2}$ to charge the capacitor $C_{ADC}$ and the charge supply circuit 202 before the analog to digital converter ADC performs the analog to digital conversion, and then the path between the supply voltage $V_{DD2}$ and the capacitor $C_{ADC}$ is cut off when the analog to digital converter ADC performs the analog to digital conversion, wherein the capacitor $C_{ADC}$, the charge supply circuit 202, and the voltage supply circuit 204 provide the reference voltage to the analog to digital converter ADC for the analog to digital conversion. As a result, the power supply circuit (e.g., system power supply) or the voltage supply circuit 204 may charge the charge supply circuit 202 before the analog to digital converter ADC performs the analog to digital conversion. Since charging time is more sufficient, power supply capacity of the power supply circuit or the voltage supply circuit 204 require less strong, thereby saving power and circuit area because if the power supply capacity of the power supply circuit is stronger, electronic components thereof must withstand large electrical energy and require large size and more area. Furthermore, the power supply circuit or the voltage supply circuit 204 does not charge the charge supply circuit 202 after the analog to digital converter ADC performs the analog to digital conversion, to save more power.

Moreover, please continue to refer to FIG. 2A. As shown in FIG. 2A, the voltage supply circuit 204 may be implemented by a voltage regulator, but is not limited that the voltage supply circuit 204 is only the voltage regulator. The voltage supply circuit 204 may include a controller 206, an error amplifier 208, a plurality of resistors 207, 209, a transistor 210, and a capacitor 212. During the period $T_2$, the level of the control signal $CON_2$ becomes a high level, and the control signal $CON_2$ controls the controller 206 to enable the error amplifier 208 for operation. The error amplifier 208 receives a threshold voltage $V_{th}$ and a feedback voltage. The resistors 207 and 209 are connected in series and coupled between the capacitor 212 and the ground, and the feedback voltage is generated by dividing the second reference voltage $Vref_2$ generated in the capacitor 212. The error amplifier 208 controls the transistor 210 according to the feedback voltage and the threshold voltage $V_{th}$. When the analog to digital converter ADC draws current causing the second reference voltage $Vref_2$ dropping, that is, the feedback voltage is less than the threshold voltage $V_{th}$, the error amplifier 208 controls the transistor 210 to be turned on, so that the supply voltage $V_{DD1}$ charges the capacitor 212. That is, the voltage supply circuit 204 is configured in a close loop to accurately maintain the voltage level of the second reference voltage $Vref_2$. The above-mentioned supply voltage $V_{DD1}$ may be identical or different from the supply voltage $V_{DD2}$ received by the charge supply circuit 202. In addition, the resistors 207 and 209 may be adjustable resistors, which may be adjusted according to practical requirements. Thus, before providing the second reference voltage $Vref_2$ to the analog to digital converter ADC, the voltage supply circuit 204 may generate and provide the supply voltage $V_{DD2}$ to the charge supply circuit 202, so that there is no need to additionally configure a power supply circuit to provide the supply voltage $V_{DD2}$.

Notably, the above-description is only embodiments of the present invention. The reference voltage generating circuit 20 of the present invention mainly utilizes the charge supply circuit 202 or the voltage supply circuit 204 to provide the reference voltage to the functional circuit according to the influence on the reference voltage caused by the electrical energy consumption of operation of the functional circuit. When the functional circuit consumes more electrical energy and has a greater influence on the reference voltage, the charge supply circuit 202 with the strong charge supply capability may be utilized for providing the reference voltage. On the contrary, when the functional circuit consumes less electrical energy and has a smaller influence on the reference voltage, the voltage supply circuit 204 with the weak charge supply capability but capable of accurately maintaining the voltage level may be utilized for providing the reference voltage. When the charge supply circuit 202 provides the reference voltage, the voltage supply circuit 204 does not provide the reference voltage to save power. In addition, the reference voltage generating circuit 20 may further predict the electrical energy consumption which affects the reference voltage before the functional circuit operates and consumes electrical energy to affect the reference voltage to dynamically compensate the electrical energy consumption in real time, thereby preventing the voltage level of the reference voltage from being influenced. For example, before the analog to digital converter ADC converts the high significant bits, the reference voltage generating circuit 20 predicts possible electrical energy consumption of the analog to digital converter ADC to dynamically compensate the electrical energy consumption in real time during the analog to digital conversion process. When the low significant bits are converted, the reference voltage generating circuit 20 generates the reference voltage via the close loop to accurately maintain the voltage level of the reference voltage. Those skilled in the art may make modification or alterations accordingly, which are not limited to this. Since the charge supply amount per unit time of the charge supply circuit 202 is greater than the charge supply amount per unit time of the voltage supply circuit 204, the voltage supply circuit 204 may have a smaller size, bandwidth or driving capacity to save circuit area and cost.

On the other hand, as shown in FIG. 2B, when the level of the clock signal CLK becomes a high level, the analog to digital converter ADC performs the analog to digital conversion according to the clock signal CLK. When the analog to digital converter ADC is reset before the period $T_1$, such as resetting the reference voltage, the analog to digital converter ADC draws a small current, so the level of the control signal $CON_2$ becomes the high level to enable the voltage supply circuit 204 to provide the second reference voltage $Vref_2$. In other embodiments, the level of the control signal $CON_1$ may also become the high level to enable the charge supply circuit 202 for reset operation. In addition, after the period $T_2$, the analog to digital converter ADC may be configured to be idle for a period of time, i.e. levels of the control signals $CON_1$ and $CON_2$ are at low levels. In other embodiments, the idle period may not be configured. Furthermore, the charge supply circuit 202 shown in FIG. 3 may be implemented by a charge compensator or a pump squeezing circuit, and is not limited to this.

Figure 4:
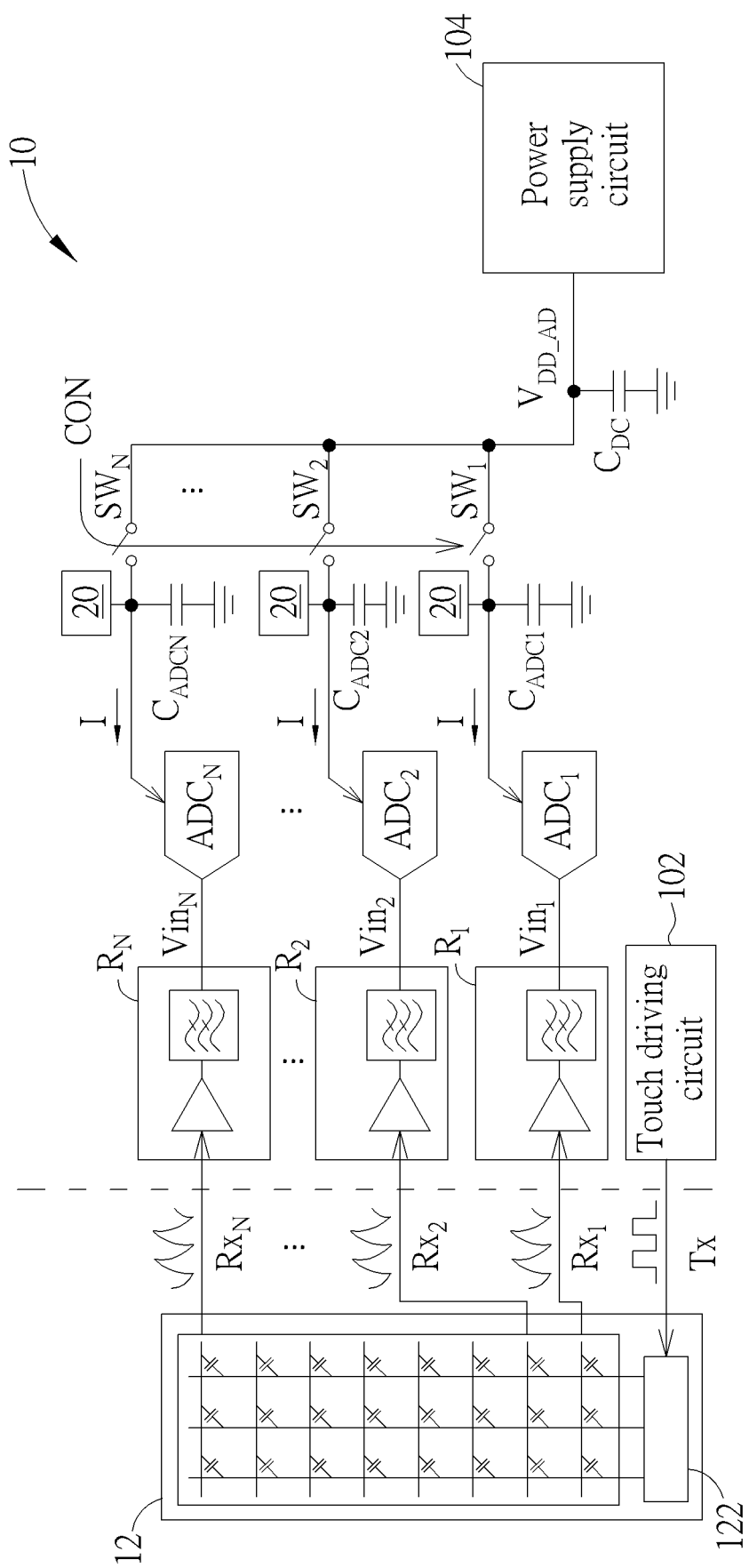
FIG. 4 is a schematic diagram of the reference voltage generating circuits utilized in a touch detection module according to an embodiment of the present invention.

Please refer to FIG. 4, which is a schematic diagram of the reference voltage generating circuits 20 utilized in a touch detection module according to an embodiment of the present invention. FIG. 4 shows a schematic diagram of the touch detection module 10 performing touch detection on a panel 12. As shown in FIG. 4, the touch module 10 includes a touch driving circuit 102, a plurality of receiving circuits $R_1$-$R_N$, a plurality of analog to digital converters $ADC_1$-$ADC_N$, a power supply circuit 104, a plurality of reference voltage generating circuits 20. The touch driving circuit 102 generates and provides a touch driving signal Tx to a selection circuit 122 of the panel 12, and the selection circuit 122 transmits the touch driving signal Tx to a plurality of columns of touch driving lines of the panel 12, respectively. The receiving circuits $R_1$-$R_N$ are coupled to a plurality of rows of touch sensing lines of the panel 12, respectively, and receives the touch sensing signals $Rx_1$-$Rx_N$ to process the touch sensing signals $Rx_1$-$Rx_N$ and generate the analog input signals $Vin_1$-$Vin_N$ corresponding to a plurality of locations of the panel 12 to the analog to digital converters $ADC_1$-$ADC_N$ for the analog to digital conversion. Each of the receiving circuits $R_1$-$R_N$ comprises an amplifier and a filter circuit. The amplifiers amplify the touch sensing signals $Rx_1$-$Rx_N$, and transmit to the filter circuits for filtering the amplified touch sensing signals $Rx_1$-$Rx_N$ to generate the input signals $Vin_1$-$Vin_N$.

The reference voltage generating circuits 20 are coupled to the analog to digital converters $ADC_1$-$ADC_N$, respectively to provide reference voltages to the analog to digital converters $ADC_1$-$ADC_N$. A plurality of capacitors $C_{ADC1}$-$C_{ADCN}$ are respectively coupled to the analog to digital converters $ADC_1$-$ADC_N$ and the reference voltage generating circuits 20 to stabilize the reference voltages. In another embodiment of the present invention, these capacitors $C_{ADC1}$-$C_{ADCN}$ may not be required. The power supply circuit 104 provides a supply voltage $V_{DD\_AD}$ to the reference voltage generation circuits 20, and charges the charge supply circuits 202 of the reference voltage generation circuits 20 and the capacitors $C_{ADC1}$-$C_{ADCN}$. In an embodiment of the present invention, the supply voltage $V_{DD\_AD}$ may be the same as the supply voltages $V_{DD1}$ and $V_{DD2}$ shown in FIG. 2A.

A plurality of switches $SW_1$-$SW_N$ are coupled between the power supply circuit 104 and the reference voltage generating circuits 20. Before the analog to digital converters $ADC_1$-$ADC_N$ perform the analog to digital conversion, the switches $SW_1$-$SW_N$ are conducted to charge the charge supply circuits 202 and the capacitors $C_{ADC1}$-$C_{ADCN}$. When the analog to digital converters $ADC_1$-$ADC_N$ perform the analog to digital conversion, the switches $SW_1$-$SW_N$ are cut off, and the power supply circuit 104 is not coupled to the capacitors $C_{ADC1}$-$C_{ADCN}$ and the reference voltage generating circuits 20. In this way, the analog to digital converters $ADC_1$-$ADC_N$ are independent of each other, so that when the analog to digital converters $ADC_1$-$ADC_N$ operate and draw currents simultaneously, noise coupled between the analog to digital converters $ADC_1$-$ADC_N$ may be avoided, and thus influence on operations of the analog to digital converters $ADC_1$-$ADC_N$ may also be avoided, which may also reduce the power consumption of the power supply circuit 104.

In addition, a capacitor $C_{DC}$ is coupled to the power supply circuit 104 to stabilize the supply voltage $V_{DD\_AD}$.

Since the capacitors $C_{ADC1}$-$C_{ADCN}$ with small capacitance are configured, capacitance of the capacitor $C_{DC}$ is small, too. In an embodiment of the present invention, except for the panel 12 and the power supply circuit 104, remaining circuits may be integrated into a chip. Because the capacitance of the capacitor $C_{DC}$ and the capacitors $C_{ADC1}$-$C_{ADCN}$ is small, the capacitor $C_{DC}$ and the capacitors $C_{ADC1}$-$C_{ADCN}$ may also be integrated in the chip without additionally configuring the capacitors outside of the chip. Thus, the component cost may be reduced, and time and cost of the procedure of configuring the capacitors outside of the chip may also be reduced, thereby reducing the failure rate and improving yield. Furthermore, in one embodiment of the present invention, the voltage supply circuit 204 may provide the supply voltage to the charge supply circuit 202, and thus the power supply circuit 104, the switches $SW_1$-$SW_N$, and the capacitor $C_{DC}$ may be not needed.

In summary, the reference voltage generating circuit of the present invention may utilize the charge supply circuit with strong charge supply capacity or the voltage supply circuit with weak charge supply capacity to provide the reference voltage according to the influence on the reference voltage caused by the electrical energy consumption of operation of the functional circuit, so as to provide the stable reference voltage. When the charge supply circuit provides the reference voltage, the voltage supply circuit does not provide the reference voltage, which may save power. In addition, the reference voltage generating circuit may predict the electrical energy consumption of the function circuit which affects the reference voltage, and dynamically perform compensation via an open loop in real time when the function circuit consumes the electrical energy to quickly respond and reduce the fluctuation of the reference voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reference voltage generating circuit, comprising:
   a charge supply circuit, providing a first reference voltage during a first period; and
   a voltage supply circuit, providing a second reference voltage during a second period;
   wherein the voltage supply circuit does not provide the second reference voltage during the first period, the reference voltage generating circuit provides the first reference voltage and the second reference voltage to an analog to digital converter, the first period is a period during which the analog to digital converter converts at least one high significant bit of an input signal, and the second period is a period during which the analog to digital converter converts at least one low significant bit of the input signal.

2. The reference voltage generating circuit of claim 1 further comprising:
   a power supply circuit, coupled to the charge supply circuit and charging the charge supply circuit.

3. The reference voltage generating circuit of claim 2, wherein the power supply circuit charges the charge supply circuit before the first period, and is not coupled to the charge supply circuit during the first period.

4. The reference voltage generating circuit of claim 1, wherein the voltage supply circuit is coupled to the charge supply circuit and charges the charge supply circuit.

5. The reference voltage generating circuit of 4, wherein the voltage supply circuit charges the charge supply circuit before the first period, and does not charge the charge supply circuit during the first period.

6. The reference voltage generating circuit of claim 1, wherein the reference voltage generating circuit provides the first reference voltage and the second reference voltage to a functional circuit, and the charge supply circuit provides the first reference voltage according to an electrical energy consumption of the functional circuit during the first period.

7. The reference voltage generating circuit of claim 6 further comprising:
a detection circuit, coupled to the charge supply circuit, and detecting the electrical energy consumption of the functional circuit during the first period to control the charge supply circuit to provide the first reference voltage.

8. The reference voltage generating circuit of claim 1, wherein the reference voltage generating circuit provides the first reference voltage and the second reference voltage to a functional circuit, the reference voltage generating circuit further comprises:
a detection circuit, coupled to the charge supply circuit, and detecting the input signal of the functional circuit to control the charge supply circuit to provide the first reference voltage.

9. The reference voltage generating circuit of claim 1 further comprising a capacitor providing the first reference voltage and the second reference voltage to a functional circuit, wherein the capacitor is coupled to the charge supply circuit, the voltage supply circuit and the functional circuit, and the charge supply circuit provides the first reference voltage to the capacitor during the first period to provide the first reference voltage to the functional circuit, and the voltage supply circuit provides the second reference voltage to the capacitor during the second period to provide the second reference voltage to the function circuit, and a power supply circuit is coupled to the charge supply circuit and the capacitor and charges the capacitor and the charge supply circuit before the first period, and the power supply circuit is not coupled to the capacitor during the first period and the second period, and the first period and the second period are operation periods of the functional circuit.

10. The reference voltage generating circuit of claim 1 further comprising a capacitor providing the first reference voltage and the second reference voltage to a functional circuit, wherein the capacitor is coupled to the charge supply circuit, the voltage supply circuit and the functional circuit, and the charge supply circuit provides the first reference voltage to the capacitor during the first period to provide the first reference voltage to the functional circuit, and the voltage supply circuit provides the second reference voltage to the capacitor during the second period to provide the second reference voltage to the function circuit, and the voltage supply circuit is coupled to the charge supply circuit and charges the capacitor and the charge supply circuit before the first period, and the voltage supply circuit is not coupled to the capacitor during the first period, and the first period and the second period are operation periods of the functional circuit.

11. The reference voltage generating circuit of claim 1, wherein a charge supply amount per unit time of the charge supply circuit is greater than a charge supply amount per unit time of the voltage supply circuit.

12. The reference voltage generating circuit of claim 1, wherein a voltage level of the second reference voltage is different from a voltage level of the first reference voltage.

13. The reference voltage generating circuit of claim 1, wherein the voltage supply circuit is a voltage regulator.

14. The reference voltage generating circuit of claim 1, wherein the first period is earlier than the second period, or the second period is earlier than the first period.

\* \* \* \* \*